United States Patent
Bashaboina et al.

(10) Patent No.: US 8,458,625 B2
(45) Date of Patent: Jun. 4, 2013

(54) YIELD ENHANCEMENT BY MULTIPLICATE-LAYER-HANDLING OPTICAL CORRECTION

(75) Inventors: Pavan Y. Bashaboina, Hyderabad (IN); James A. Culp, New Paltz, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/193,716

(22) Filed: Jul. 29, 2011

(65) Prior Publication Data

US 2013/0031519 A1    Jan. 31, 2013

(51) Int. Cl.
  *G06F 17/50*    (2006.01)
(52) U.S. Cl.
  USPC .............................................. 716/53; 716/54
(58) Field of Classification Search
  USPC ...................................................... 716/53, 54
  See application file for complete search history.

(56) References Cited

U.S. PATENT DOCUMENTS

| 6,301,690 | B1 | 10/2001 | Ditlow et al. | |
| 7,154,791 | B2 | 12/2006 | Kim | |
| 7,627,832 | B2 * | 12/2009 | Ludmann | 715/781 |
| 7,814,447 | B2 * | 10/2010 | Scheffer et al. | 716/100 |
| 7,958,463 | B2 * | 6/2011 | Ikeuchi | 716/54 |
| 8,176,445 | B1 * | 5/2012 | Qian | 716/52 |

OTHER PUBLICATIONS

Kahng, A.B., "Lithography and Design in Partnership: A New Roadmap" Proc. SPIE Advanced Lithography Symposium (Feb. 25, 2008) 10 pp., vol. 7122.

Jess, J.A.G. et al., "Statistical Timing for Parametric Yield Prediction of Digital Integrated Circuits" Design Automation Conference (DAC) (Jun. 2-6, 2003) pp. 932-937.

Alam, S.M. et al., "Circuit Level Reliability Analysis of Cu Interconnects" IEEE Explore, 5th International Symposium on Quality Electronic Design (Aug. 24, 2004) pp. 238-243.

* cited by examiner

*Primary Examiner* — Vuthe Siek
(74) *Attorney, Agent, or Firm* — Scully, Scott, Murphy & Presser, P.C.; Yuanmin Cai (57) ABSTRACT

Potential lithographic hot spots associated with a lithographic level are marked by a marker layer identifying a marked region. Multiplicate layers are generated for each design shape in that lithographic level in each marked region. Each multiplicate layer includes a different type of variant for each design shape in the lithographic level. The different types of variants correspond to different design environments. Lithographic simulation is performed with each type of variants under the constraint of long range effects, such as pattern density, provided by adjacent shapes in the lithographic level. In each marked region, the results of lithographic simulations are evaluated to determine an optimal type among the variants. The optimal type is retained for the lithographic level in each marked region, thereby providing a chip design layout in which various marked regions can include different types of variant shapes to provide local lithographic optimization.

20 Claims, 6 Drawing Sheets

YIELD ENHANCEMENT BY MULTIPLICATE-LAYER-HANDLING OPTICAL CORRECTION

BACKGROUND

The present disclosure relates to methods and systems for semiconductor manufacturing, and particularly to methods and systems for enhancing yield and turnaround time (TAT) in semiconductor device manufacturing by employing multiplicate-layer-handling optical correction.

With continual scaling of dimensions in semiconductor devices and increase in the number of gates per chip, increasing yield and reducing turnaround time has become critical for economical and profitable operation of chip manufacturing facilities. Lithographic processing steps tend to be some of the most challenging steps that significantly affect yield and turnaround time in semiconductor manufacturing.

Optical corrections, including optical proximity correction (OPC) and optical rule checking (ORC), are employed to simulate the printability of a chip design layout prior to manufacturing. Typically, optical corrections are performed to the chip design layout to determine the printability thereof. Multiple iterative revisions to the chip design layout may be necessary to ensure that the final chip design layout has sufficient printability.

In practice, design rules in advanced technology nodes have grown in length and complexity that it has become almost impossible to define design rules which can provide minor changes to design shapes depending on layout environments. Further, a set of optimum design shapes for a particular level can be different depending on various factors such as pattern density. For example, the optimum shape (including the size) of contact vias can be different depending on whether the chip design layout has a pattern density of 10% or 90% for the contact vias. In addition, long length scale problems, such as nonuniformity introduced in chemical mechanical planarization (CMP) processes and/or rapid thermal annealing (RTA) processes, are not addressed in optical correction processes known to data. Thus, even in mature technology nodes, application of design rules do not automatically result in a manufacturable design that provides high yield and/or rapid turnaround time.

At a macro design phase or a block design phase, pattern density information for a neighboring macro or a neighboring block is not available. Thus, each macro or each block is designed as a stand-alone design in existing design methods.

BRIEF SUMMARY

Potential lithographic hot spots associated with a lithographic level are identified in a chip design layout, and are marked by a marker layer identifying a marked region. Multiplicate layers are generated for each design shape in that lithographic level in each marked region. Each multiplicate layer includes a different type of variant for each design shape in the lithographic level. The different types of variants correspond to different design environments. Lithographic simulation is performed with each type of variants under the constraint of long range effects, such as pattern density, provided by adjacent shapes in the lithographic level. In each marked region, the results of lithographic simulations are evaluated to determine an optimal type among the variants. The optimal type is retained for the lithographic level in each marked region, thereby providing a chip design layout in which various marked regions can include different types of variant shapes to provide local lithographic optimization.

According to an aspect of the present disclosure, a method for modifying a chip design layout is provided. The method includes: marking, in a chip design layout, regions of potential lithographic hot spots associated with an instance of a design shape with marker layers; adding multiplicate shapes to said instance of the design shape in the marker layers in the chip design layout; performing lithographic simulations for each marker layer in the chip design layout by running an optical correction program having multiplicate layer handling capability, wherein each of the multiplicate shapes is successively employed to perform lithographic simulations for said instance of the design shape in the marker layers; calculating a lithographic performance metric for each of the lithographic simulations; generating a modified chip design layout by selecting, for each marker layer, a multiplicate shape that satisfies at least one predefined selection criterion for the lithographic performance metric; and storing data representing the modified chip design layout in a non-transitory machine readable storage medium by encoding the data therein.

According to another aspect of the present disclosure, a system for modifying a chip design layout is provided. The system includes at least one computing means and a non-transitory machine readable storage medium. The at least one computing means is configured to perform the steps of: marking, in a chip design layout, regions of potential lithographic hot spots associated with an instance of a design shape with marker layers; adding multiplicate shapes to said instance of the design shape in the marker layers in the chip design layout; performing lithographic simulations for each marker layer in the chip design layout by running an optical correction program having multiplicate layer handling capability, wherein each of the multiplicate shapes is successively employed to perform lithographic simulations for said instance of the design shape in the marker layers; calculating a lithographic performance metric for each of the lithographic simulations; generating a modified chip design layout by selecting, for each marker layer, a multiplicate shape that satisfies at least one predefined selection criterion for the lithographic performance metric; and storing data representing the modified chip design layout in the non-transitory machine readable storage medium by encoding the data therein.

DETAILED DESCRIPTION

As stated above, the present disclosure relates to methods and systems for enhancing yield and turnaround time (TAT) in semiconductor device manufacturing by employing multiplicate-layer-handling optical correction, which are now described in detail with accompanying figures. Like and corresponding elements are referred to by like reference numerals. The drawings are not necessarily drawn to scale.

Figure 1:
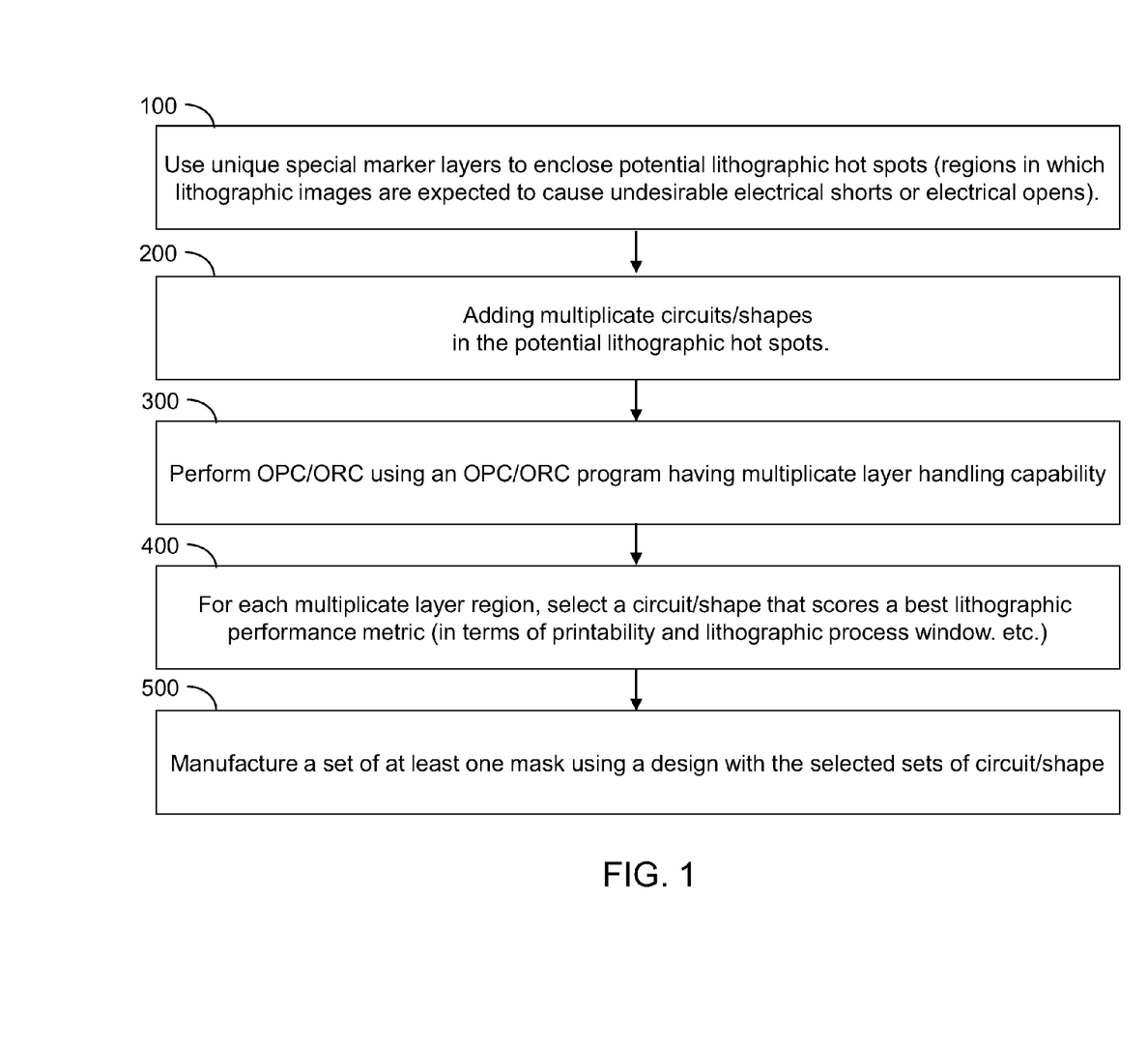
FIG. 1 is a flow chart illustrating a method of manufacturing a set of at least one reticle using a chip design layout modified to enhance lithographic performance according to an embodiment of the present disclosure.

Referring to FIG. 1, a flow chart illustrates a method of manufacturing a set of at least one reticle (lithographic mask) using a chip design layout modified to enhance lithographic performance. The enhancement of lithographic performance can lead to enhancement in lithographic yield, product yield, and product reliability of semiconductor chips that are manufactured employing the modified chip design layout. Further, this method can also be employed to optimize a chip design layout employing multiplicate-layer-handling optical correction.

Referring to step 100, a chip design layout including at least one design level is provided. Each of the at least one design level can represent a lithographic level employed in a manufacturing sequence for manufacturing semiconductor chips embodying the design in the chip design layout. Each design level includes at least one design shape. Depending on the nature of a design level, the design level can include only a single type of design shape or many different types of design shapes. For example, a contact via level or interconnect metal via (Vx) levels may include only a single type of design shape, i.e., a design shape for a contact via hole or a metal interconnect via hole, while a recessed oxide (RX) level, a gate conductor (GC) level, and interconnect metal line (MX) levels may include multiple types of design shapes, i.e., various design shape each having different shapes. If multiple types of design shapes are present in a design level, each type geometrically differs from other types, e.g., by at least one of dimensions, angles, or other geometric interrelations between line or curve segments that define a design shape. For example, design shapes representing different metal lines may have different lengths, widths, or inflection.

A set of at least one design shape that is known to be associated with potential lithographic printing problems are identified in the chip design layout. If a region includes a design shape known to be associated with potential lithographic printing problems, such a region is referred to as a potential lithographic hot spot. A potential lithographic hot spot is a region in which lithographic images are expected to cause undesirable electrical shorts or electrical opens upon formation of a corresponding structure in a semiconductor chip. If a design level includes only a single type of design shape, this design shape can be deemed to be associated with potential lithographic printing problems if any lithographic printing problem is expected at the design level. If a design level includes multiple types of design shapes, the types of design shapes deemed to be associated with potential lithographic printing problems can be identified with an automated program or by manual identification.

Once the set of at least one design shape is defined, for each design shape in the set of at least one design shape, regions in which at least one instance of the design shape is present are marked with a marker layer. Thus, regions of potential lithographic hot spots associated with an instance of each identified design shape are marked with marker layers in the chip design layout, thereby a first modified chip design layout that includes the marker layers. In one embodiment, the regions of potential lithographic hot spots in the chip design layout can be identified employing an automated program that analyzes geometrical features in the chip design layout around each instance of the design shape.

Referring to step 200, for each design shape in one or more design levels in the chip design layout, multiplicate shapes are added to each instance of the in the marker layers in the chip design layout. Each of the multiplicate shapes represents a variant design shape, i.e., an alternate design, for the design shape. In one embodiment, each variant design shape can include at least one modification to the design shape that can enhance lithographic printability in one aspect. The design shape as originally present in the chip design layout before addition of the multiplicate shapes is referred to as the "original" design shape to be distinguished from the design shapes of the multiplicate shapes. In another embodiment, one of the multiplicate shapes may be identical to the original design shape. In this embodiment, the set of multiplicate shapes includes one original design shape and at least one variant design shape.

A design shape may be modified only at a single edge or a plurality of edges of the design shape. Alternately, a design shape may be modified to a set of geometrical features to a degree that is sufficient to affect circuit performance. If modifications are made to a design shape to the degree that affects circuit performance, the design shape may be referred to as a design circuit, and the modifications are referred to as a variant design circuit. As used herein, a design shape includes one or more unit design shapes that define a unit component of a semiconductor device, a sub-unit of a unit component of a semiconductor device, a plurality of components of a semiconductor device, a single semiconductor device, a plurality of semiconductor devices, or a set of semiconductor devices that constitutes a circuit.

For example, a first variant design shape may be smaller than the design shape so that a conductive component corresponding to an instance the first variant design shape in a semiconductor chip is not electrically shorted to an adjacent conductive component or, alternately, a conductive path corresponding to an instance of the first variant design in a semiconductor chip does not form an electrical open therein. In addition, a second variant design may be larger that the design shape so that a conductive component corresponding to an instance the second variant design shape in a semiconductor chip does not form an electrical open therein or, alternately, a conductive path corresponding to an instance of the second variant design in a semiconductor chip is not electrically shorted to an adjacent conductive component. Further, additional variant design shapes may provide different degrees of modification to prevent undesirable electrical opens or undesirable electrical shorts. Yet further, the additional variant design shapes may provide a wider or a narrower conductive path and/or a thicker, thinner, deeper, or shallower conductive path or electrical isolation structure to modulate the degree of electrical connection or electrical isolation associated with the design shape.

The multiplicate shapes are added wherever any instance of the original design shape is marked with a marker layer. If multiple types of design shapes are marked with a marker layer, each design shape may be associated with a different set of multiplicate shapes. In other words, the set of multiplicate shapes that are added to an instance of a design shape depends on the design shape. Thus, if N different types of original design shapes are marked with marker layers, up to N different sets of multiplicate shapes may be provided so that an i-th set of multiplicate shapes are added to each instance of an i-th design shape. The number of multiplicate shapes in each set of multiplicate shapes may be the same or different across different sets of multiplicate shapes. The number of multiplicate shapes in a set of multiplicate shapes corresponding to a single original design shape may be typically from 2 to 1,000, and more typically from 2 to 10, although a greater number can also be employed. A second modified design is derived from the first modified design by adding corresponding multiplicate shapes to each marker layer at step 200.

Referring to step 300, an optical correction program having multiplicate layer handling capability is run for all design levels including marker layers. Each of the multiplicate shapes is successively employed to perform optical corrections for each instance of the design shape in the marker layers. The optical correction program having multiplicate layer handling capability can be configured to apply at least one of optical proximity correction (OPC) and optical rule checking (ORC). As used herein, OPC refers to a photolithography enhancement technique used to compensate for image errors due to diffraction or process effects as known in the art. As used herein, ORC refers to OPC verification in which rule checks are performed on wafer print image simulation to predict failures.

The optical correction program having multiplicate layer handling capability calculates effects of shapes located outside a selected marker layer upon a lithographically simulated printed image of each multiplicate shape within the selected marker.

Figure 2:
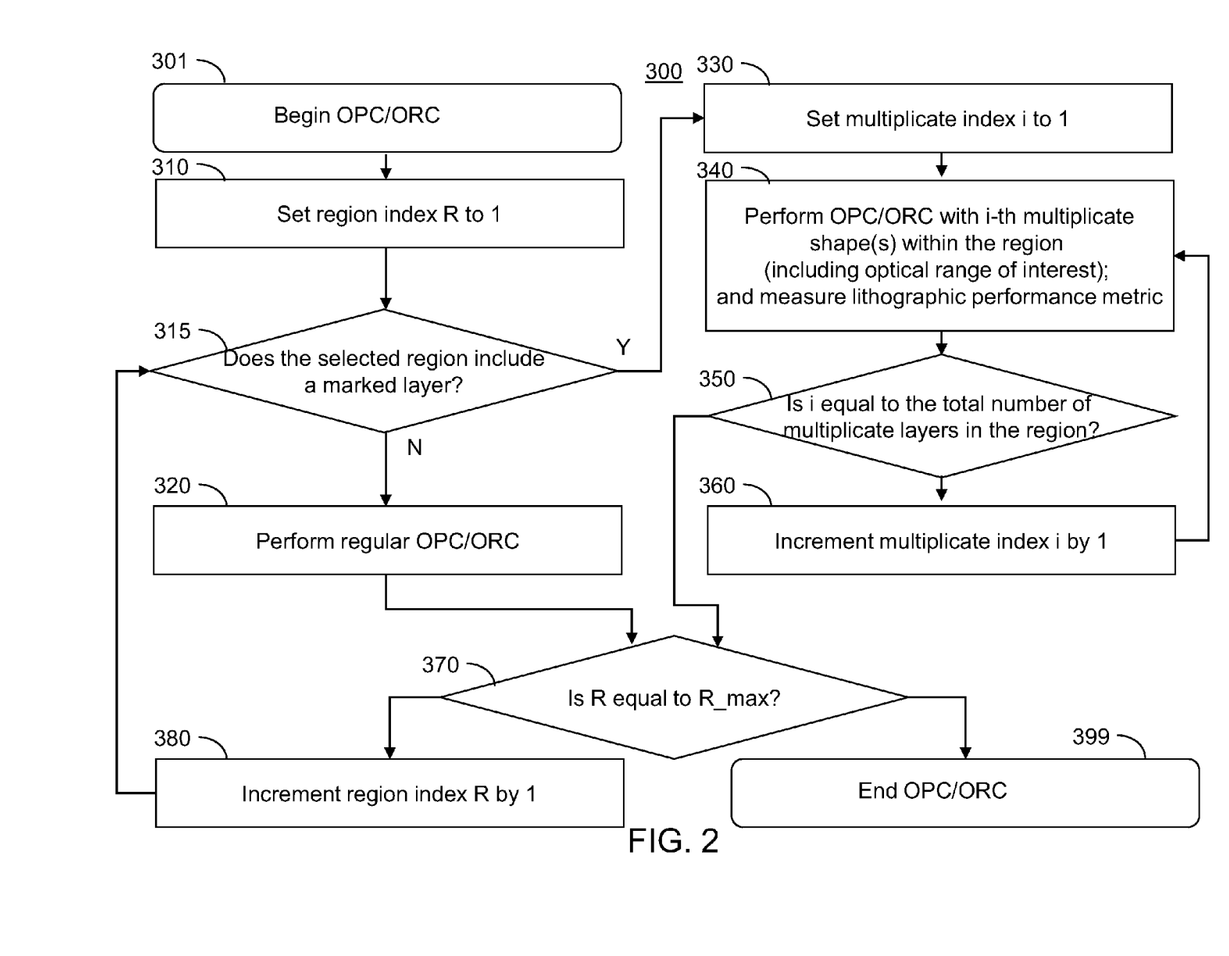
FIG. 2 is flow chart illustrating a method of performing multiplicate-layer-handling optical correction according to an embodiment of the present disclosure.

Referring to FIG. 2, a flow chart illustrates a sequence of steps that can be employed to perform step 300 in FIG. 1. Specifically, multiplicate-layer-handling optical correction can be performed employing the steps of the flow chart in FIG. 2 for each design level in the second modified chip design layout. The steps in the flow chart of FIG. 2 can be performed by an automated system including at least one computing means such as at least one computer. In one embodiment, the multiple-layer-handling optical correction can be performed sequentially for each design layer including instances of at least one design shape that are marked with marker layers. In another embodiment, each such design layer can be sequentially selected at each step in the flow chart of FIG. 2. All design layers including marked instances of at least one design shape are processed with multiplicate-layer-handling optical correction.

Referring to step 301, multiplicate-layer-handling optical correction begins for each selected design layer. The selected design layer may be the only design layer including marked layers in a chip design layout or one of the multiple design layers including marked layers. The chip design layout is divided into a number R of regions. Each of the marker layers is included in one of the number R of regions. Each of the number R of regions can include no marker layer, a single marker layer, or multiple marker layers. In one embodiment, each of the number R of regions can include none or only one of the marker layers.

For example, if a design level includes only a single design shape representing a contact via or a interconnect metal via, all regions including at least one instance of the design shape for that design level include marked layers. If a design level includes multiple design shapes and a subset of design shapes less than all of the multiple design shapes are marked with marked layers, for example, in a gate conductor level or in an interconnect metal line level, some regions may not include any marker layer and some other regions may include at least one marker layer.

In one embodiment, the regions can be divided without regard to the number of design layers present therein. In another embodiment, the regions can be divided to include a predetermined number of levels so that a set of multiple regions correspond to a same physical area on a manufactured semiconductor chip.

Between step 310 and step 399, optical corrections are successively performed on each of the multiplicate shapes located within the number R of regions. Referring to step 310, a region index R for running an automated program for multiplicate-layer-handling optical correction on a computing means is set to 1.

Referring to step 315, an automated program running on the computing means determines whether the selected region, i.e., the region of the chip design layout labeled with the current value of the region index R, includes any of the marked layers. The optical correction program having multiplicate layer handling capability may be subsequently run only if a selected region includes one or more of the marker layers.

If the selected region does not include any of the marker layers, step 320 is performed. At step 320, a normal optical correction program is run on design shapes in the selected region, which include only unmarked design shapes. The unmarked design shapes are identical to the design shapes as provided in the chip design layout at step 100 in FIG. 1 prior to generating any marked layers. Any optical correction program known in the art can be employed for the normal optical correction program.

After step 320, step 370 is performed. At step 370, a determination is made on whether the region index R is equal to the maximum number for the region index R_max, which is the same as the total number of regions in the chip design layout as divided at step 310.

If the region index R is less than the maximum number for the region index R_max at step 370, step 380 is performed. At step 380, the region index R is incremented by 1. The process flow is directed to step 315 thereafter.

If the region index R is equal to the maximum number for the region index R_max at step 370, step 399 is performed. The results of all optical corrections up to that step are saved in a non-transitory machine readable medium as a third modified chip design layout, and step 300 in FIG. 1 ends. Thus, the third modified chip design layout is updated at each pass through step 340.

If the selected region includes any of the marker layers, steps 330, 340, and 350 are sequentially performed. A multiplicate index i is set to 1 at step 330. If the selected region includes a single instance of a design shape that is marked with a marker layer, the multiplicate index i runs from 1 to the total number M of multiplicate shapes for the design shape in steps 340, 350, and 360. If the selected region includes two or more instances of at least one design shape, the numbers of multiplicate shapes $M_k$ for each of the two or more instances of at least one design shape in the selected region are summed to calculate the maximum value M' for the multiplicate index. In other words, $M'=\Sigma M_k$, wherein the summation is performed over al instances of the at least one design shape in the selected region. In both embodiments, each multiplicate shape in the selected region is assigned a unique multiplicate index between 1 and the maximum value.

Referring to step 340, an optical correction program having multiplicate layer handling capability is run on the selected region by making a single alteration to the chip design layout as originally provided. This alteration is the substitution of an instance of an original design shape with an instance of a multiplicate shape that corresponds to the multiplicate index i. This, if the multiplicate index i has a value of j, the j-th multiplicate shape among the M multiplicate shapes or M' multiplicate shapes substitutes the instance of the corresponding original design shape. The corresponding original design shape is marked with a marker layer at step 100 in FIG. 1, and the j-th multiplicate shape is one of the multiplicate shapes that are added at step 200 in FIG. 1.

The optical correction is performed on an area including the selected region and neighboring regions that can affect the printability of lithographic image in the selected region. The range that corresponds to all of the neighboring regions that can affect the printability of lithographic image in the selected region is herein referred to as an "optical range of interest." By performing the optical corrections based on other design shapes located within the optical range of interest, the optical effect of all instances of design shapes in the design level within the optical range of interest is reflected on the results of the optical correction on the selected variant of the design shape, i.e., on the j-th multiplicate shape if the value of the multiplicate index i is j at step 340. As discussed above, the optical correction can be OPC.

The second modified chip design layout is continually updated to include a latest modification to a multiplicate shape on which optical correction is performed at each pass through step 340. In other words, the optical correction to the j-th multiplicate shape in the selected region, which is generated by the optical correction program with multiplicate-layer-handling capability while the multiplicate index i has a value of j, can be stored in a non-transitory machine readable medium as known in the art at the end of each pass through step 340.

Referring to step 350, a determination is made on whether the multiplicate index i is equal to the maximum number for the multiplicate index i, which is M or M' depending on embodiments.

If the multiplicate index i is less than the maximum number for the multiplicate index i, step 360 is performed. At step 360, the multiplicate index is incremented by 1. The process flow is directed to step 340 thereafter. By looping through steps 340, 350, and 360, optical correction is performed for all multiplicate shapes in the selected region.

If the multiplicate index i is equal to the maximum number for the multiplicate index i for the selected region, the process flow is directed to step 370. At the completion of the steps in FIG. 2, the third modified chip design layout is finalized. The third chip design layout includes a set of optically corrected multiplicate shapes for each instance of design shapes marked with a marker layer at step 100.

During the steps of the flow chart in FIG. 2, for each design shape in a selected design level, optical corrections are performed for each marker layer in the second modified chip design layout. By performing the steps in FIG. 2 on all design levels including marker layers, optical corrections can be performed for each design level that is selected one at a time. Referring back to step 300 in FIG. 1, for each design level, optical corrections can be performed for each design shape having instances that are marked with marker layers.

Referring to step 400, lithographic simulations are performed for all design levels including marker layers. Each design level can be sequentially selected for the lithographic simulations, i.e., the lithographic simulations can be performed for each design level that is selected one at a time. Further, for each design level, lithographic simulations can be performed for each design shape having instances that are marked with marker layers. Thus, a lithographic simulation is performed for each instance of a multiplicate shape in a selected design level.

Each optically corrected multiplicate shape can be sequentially selected for a lithographic simulation. Each lithographic simulation is performed in the optical range of interest around the selected optically corrected multiplicate shape, i.e., on an area including the region of each selected optically corrected multiplicate shape and neighboring regions that can affect the printability of lithographic image of the selected optically corrected multiplicate shape. By performing the lithographic simulations based on other design shapes located within the optical range of interest, the optical effect of all instances of design shapes in the design level within the optical range of interest is reflected on the results of the lithographic simulation on the selected optically corrected multiplicate shape.

A lithographic performance metric is calculated for each of the lithographic simulations that employ an instance of a multiplicate shape corresponding to each instance of the original design shape. The lithographic performance metric can include, but is not limited to, at least one lithographically simulated quantity selected from a width of an exposure dose window, a range of depth of focus, an area of a two dimensional process window for exposure dose and depth of focus, and a mathematically weighted combination thereof. Further, the lithographic performance metric can include, but is not limited to, at least one lithographically simulated quantity selected from a minimum distance between two printed features, a minimum width of a printed feature, an area of a region having a width less than a predetermined dimension and located between two printed features, an area of a region having a width less than a predetermined dimension within a printed feature, and a mathematically weighted combination thereof.

A fourth modified chip design layout is generated by selecting, for each marker layer, a multiplicate shape that satisfies at least one predefined selection criterion for the lithographic performance metric. In one embodiment, the at least one predefined selection criterion for the lithographic performance metric can be maximization of the lithographic performance metric. As discussed above, each multiplicate shape at step 400 includes an optical correction provided in step 300. The fourth modified chip design layout can be updated after each lithographic simulation on an instance of a design shape with a marker layer, i.e., after each selection of an optically corrected multiplicate shape based on comparison of corresponding lithographic performance metrics. The fourth modified chip design layout is finalized when all lithographic simulations are completed and an optically corrected multiplicate shape is selected for each instance of design shapes marked with marker layers.

The data representing the fourth modified chip design layout is stored in a non-transitory machine readable storage medium by encoding the data in the non-transitory machine readable storage medium employing data encoding methods known in the art. In one embodiment, the encoded data can be stored in a form of a netlist or in a data format used for the exchange of layout data of integrated circuits.

Referring to step 500, a set of at least one mark can be manufactured employing a final version of the fourth modified chip design layout. The set of at least one mark can be can be manufactured, for example, by transmitting the data representing the fourth modified chip design layout and stored in a non-transitory machine readable medium to a mask writer by electronic means or by physical transfer of the non-transitory machine readable medium to a device electrically connected to the mask writer and configured to read the data in the non-transitory machine readable medium.

Figure 3:
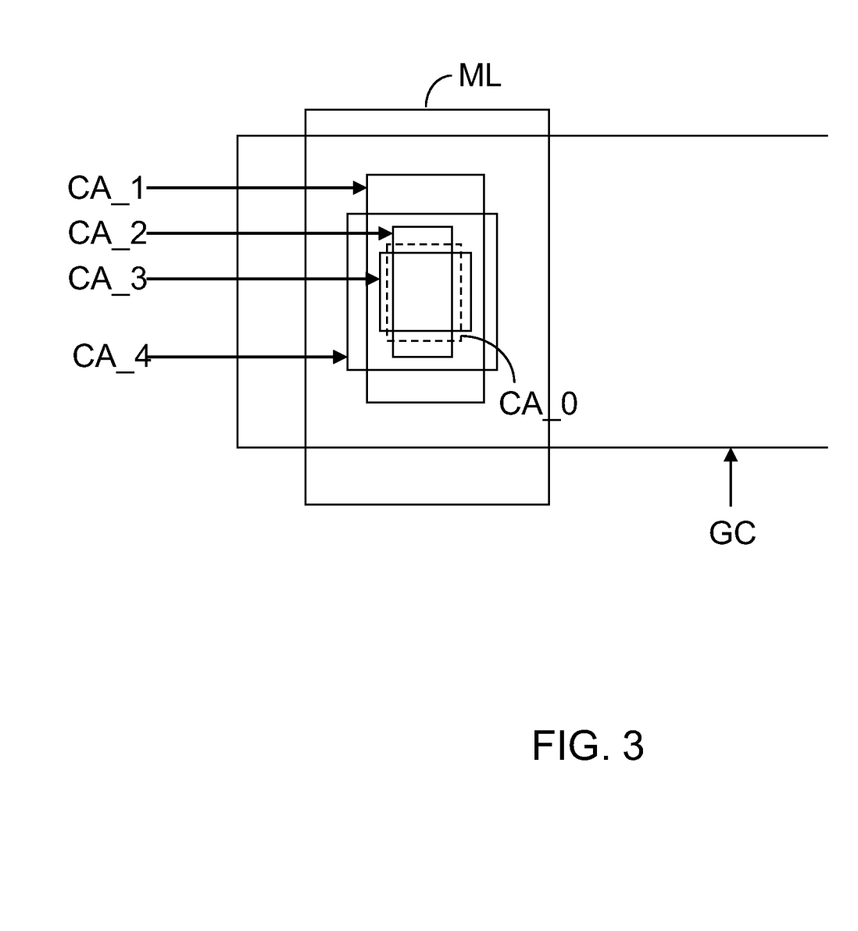
FIG. 3 is a diagram illustrating an exemplary set of multiplicate shapes at CA level according to an embodiment of the present disclosure.

Referring to FIG. 3, a diagram illustrates an exemplary set of multiplicate shapes at contact via (CA) level according to an embodiment of the present disclosure. Specifically, an instance of a contact via design shape CA_0 landing on a gate conductor (GC) line is marked with a marker layer ML. A set of four multiplicate shapes, each labeled as CA_1, CA_2, CA_3, or CA_4, is added to the instance of the contact via design shape CA_0.

Figure 4A:
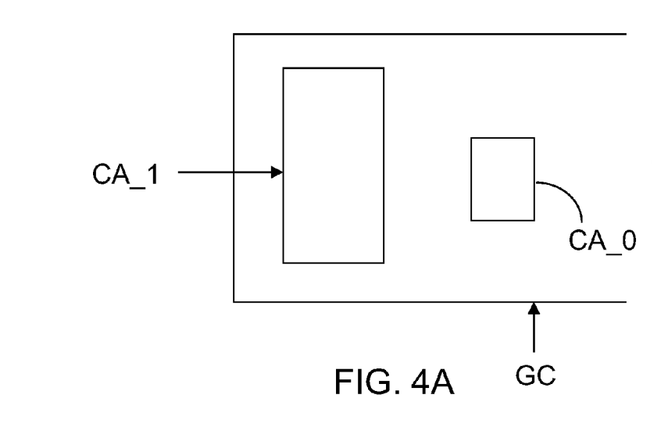
FIG. 4A-4D are diagrams illustrating optical correction to the different multiplicate shapes for an instance of a contact via at CA level according to an embodiment of the present disclosure.
Figure 4B:
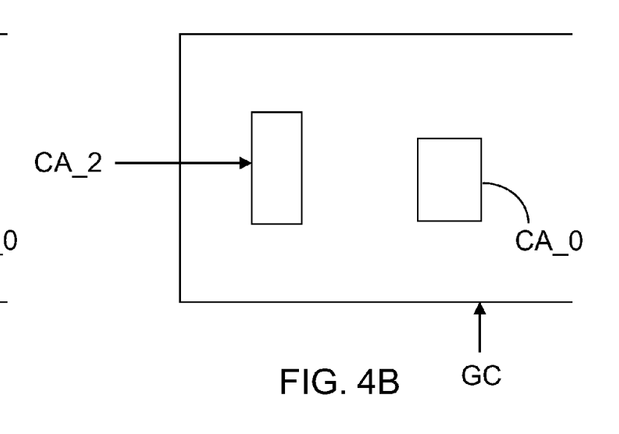
Figure 4C:
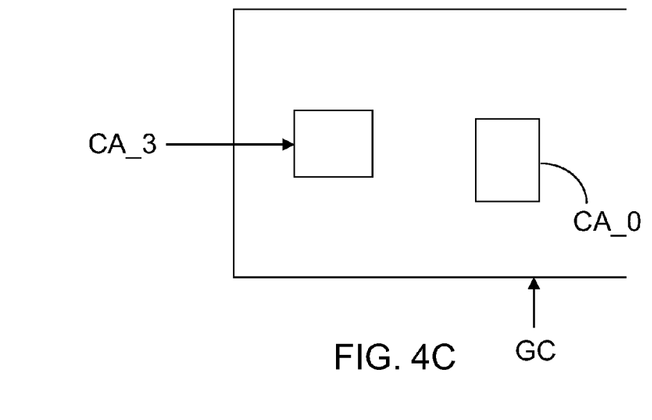
Figure 4D:
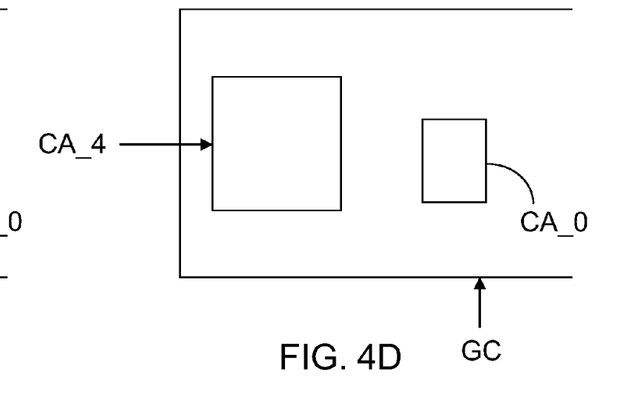
Figure 5A:
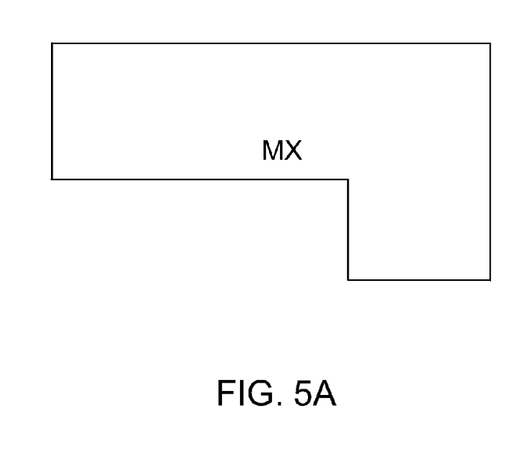
FIGS. 5A-5D are diagrams illustrating a set of multiplicate shapes at MX level.
Figure 5B:
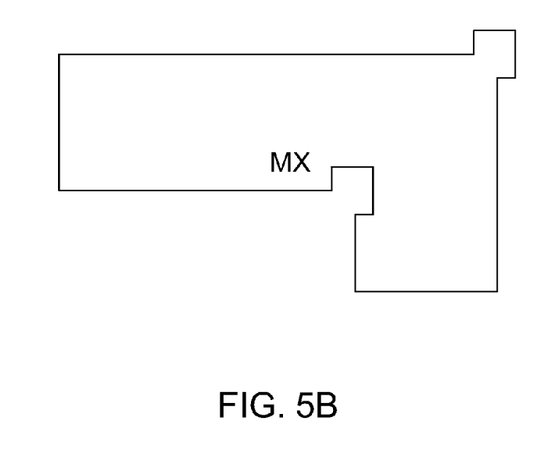
Figure 5C:
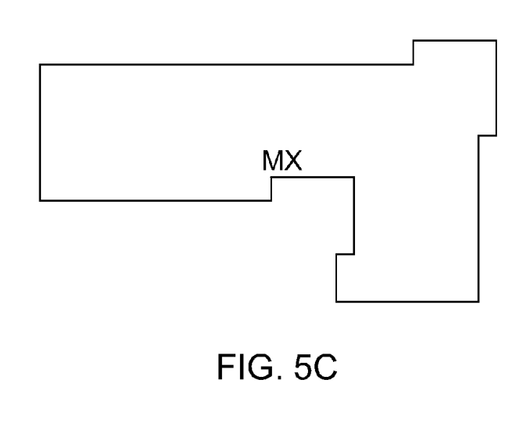
Figure 5D:
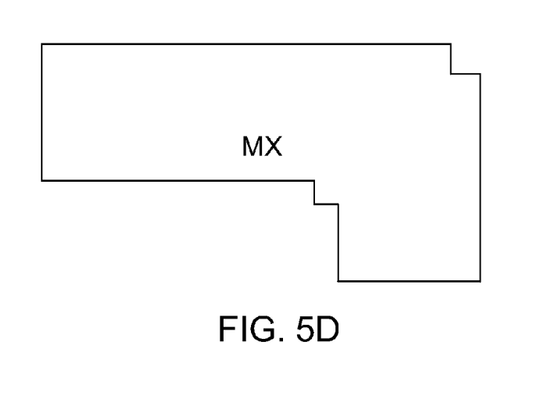

Referring to FIG. 4A-4C, diagrams illustrating optical correction to each multiplicate shape for an instance of a contact via design shape at CA level. In FIG. 4A, a first instance of the contact via design shape CA_0 is replaced with a first multiplicate shape CA_1. A second instance of the contact via design shape CA_0 is located in proximity to the first multiplicate shape CA_1. Optical correction can be performed on the first multiplicate shape CA_1 based on the effects of the presence of the second instance of the contact via design shape CA_0 in the form of the original design shape. Similar corrections can be made to the second multiplicate shape CA_2, the third multiplicate shape CA_3, and the fourth multiplicate shape CA_4. Once the optical corrections to the multiplicate shapes for the first instance of the contact via design shape CA_0 are calculated, optical corrections to the multiplicate shapes (not shown) for the second instance of the contact via design shapes CA_0 can be performed employing the original design shape for the first instance of the contact via design shape CA_0.

Referring to FIGS. 5A-5D, diagrams illustrate an exemplary set of multiplicate shapes at an interconnect metal line (MX) level according to an embodiment of the present disclosure. Specifically, each of FIGS. 5A, 5B, 5C, and 5D illustrate a multiplicate shape that can be employed for an original design shape. In one embodiment, one of the multiplicate design shapes can be identical to the original design shape, e.g., the design shape of FIG. 5A.

In general, the multiplicate shapes can differ among one another in at least one attribute selected from a total cross-sectional area, a length-to-width ratio, and corner rounding.

Figure 6:
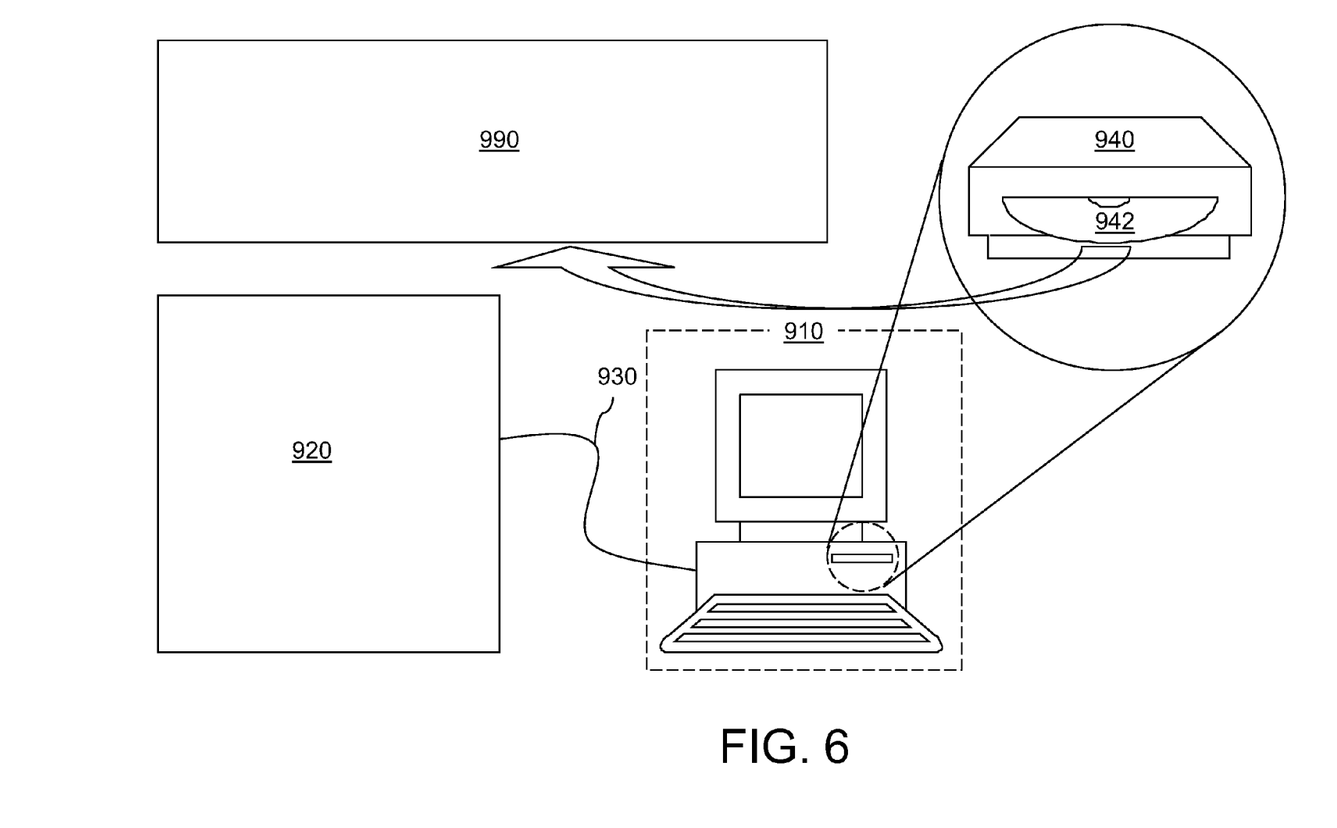
FIG. 6 is a view of an exemplary system for manufacturing a set of at least one lithographic mask in which a chip design layout is optimized employing multiplicate-layer-handling optical correction according to an embodiment of the present disclosure.

Referring to FIG. 6, a system can be provided for manufacturing a set of at least one lithographic mask in which a chip design layout is optimized employing multiplicate-layer-handling optical correction. The system can include at least one computing means 910, which can include a computer. The at least one computing means 910 can be in communication with a database 920, which can be a standalone computing means or can be incorporated into the at least one computing means 910. If the database 920 is a standalone computing means, a data cable 930 or wireless communication can be employed to transfer data between the database 920 and the at least one computing means 910.

The at least one computing means 910 can be employed to perform at least one or all of steps 100, 200, 300, and 400 in FIG. 1 to modify a chip design layout. The at least one computing means 910 can be configured to perform the various steps in FIG. 1 automatically without human intervention once a chip design layout is provided. The first modified chip design layout, the second modified chip design layout, the third modified chip design layout, the fourth modified chip design layout, and/or any intermediate modified chip design layout can be stored in at least one non-transitory machine-readable data storage medium that can be provided within the at least one computing means 910 and/or within at least one non-transitory machine-readable data storage medium provided within the database 920. The non-transitory machine-readable data storage medium may be of any type known in the art.

One or more non-transitory machine readable medium within the at least one computing means 910 and/or the database 920 can be a portable non-transitory machine-readable data storage medium 942 such as a CD ROM or a DVD ROM. A data-writing device 940 may be provided in the at least one computing means 910 or within the database 920 to enable encoding of the data representing any of the data employed during the various steps in FIG. 1.

The final version of the fourth modified chip design layout is transferred to a mask writing device 990 to enable manufacturing of a set of at least one lithographic mask (reticle) encoding the final version of the fourth modified chip design layout. The data transfer to the mask writing device 990 can be effected by a portable non-transitory machine-readable data storage medium 942, a data cable (not shown) or by wireless communication.

The various data employed in the method of the present disclosure, including the first modified chip design layout, the second modified chip design layout, the third modified chip design layout, the fourth modified chip design layout, and/or any intermediate modified chip design layout, can be in any data format used for the exchange of layout data of integrated circuits and/or symbolic data format (e.g. information stored in a GDSII (GDS2), GL1, OASIS, map files, or any other suitable format for storing such design data structures). The various data may comprise information such as, for example, symbolic data, map files, test data files, design content files, layout parameters, and any other data required by a reticle manufacturer to manufacture a set of at least one reticle encoding the fourth modified chip design layout.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method for modifying a chip design layout, said method comprising steps of:

marking, in a chip design layout, regions of potential lithographic hot spots associated with an instance of a design shape with marker layers;

adding multiplicate shapes to said instance of said design shape in said marker layers in said chip design layout;

performing lithographic simulations for each marker layer in said chip design layout by running an optical correction program having multiplicate layer handling capability, wherein each of said multiplicate shapes is successively employed to perform lithographic simulations for said instance of said design shape in said marker layers;

calculating a lithographic performance metric for each of said lithographic simulations;

generating a modified chip design layout by selecting, for each marker layer, a multiplicate shape that satisfies at least one predefined selection criterion for said lithographic performance metric; and storing data representing said modified chip design layout in a non-transitory machine readable storage medium by encoding said data therein, wherein at least one of said steps among said step of marking, said step of adding, said step of performing, said step of calculating, and said step of generating is performed employing at least one computing means that is configured to run at least one automated program for performing said at least one of said steps.

2. The method of claim 1, wherein said multiplicate shapes differ among one another in at least one attribute selected from a total cross-sectional area, a length-to-width ratio, and corner rounding.

3. The method of claim 1, further comprising:
determining whether a selected region for each lithographic simulation includes any of said marker layers; and
running a normal optical correction program on said selected region if said selected region does not include any of said marker layers.

4. The method of claim 1, further comprising:
determining whether a selected region for each lithographic simulation includes any of said marker layers; and
running said optical correction program having multiplicate layer handling capability on said selected region if said selected region includes any of said marker layers.

5. The method of claim 1, further comprising:
dividing said chip design layout into a number R of regions, wherein each of said marker layers is included in one of said number R of regions;
successively performing a lithographic simulation on each of said number R of regions, wherein said optical correction program having multiplicate layer handling capability is run only if a selected region includes one or more of said marker layers.

6. The method of claim 5, wherein each of said number R of regions includes none or only one of said marker layers.

7. The method of claim 1, wherein said lithographic performance metric includes at least one lithographically simulated quantity selected from a width of an exposure dose window, a range of depth of focus, an area of a two dimensional process window for exposure dose and depth of focus, and a mathematically weighted combination thereof.

8. The method of claim 1, wherein said lithographic performance metric includes at least one lithographically simulated quantity selected from a minimum distance between two printed features, a minimum width of a printed feature, an area of a region having a width less than a predetermined dimension and located between two printed features, an area of a region having a width less than a predetermined dimension within a printed feature, and a mathematically weighted combination thereof.

9. The method of claim 1, further comprising identifying said regions of potential lithographic hot spots in said chip design layout employing an automated program that analyzes geometrical features in said chip design layout around each instance of said design shape.

10. The method of claim 1, wherein said optical correction program having multiplicate layer handling capability applies at least one of optical proximity correction and optical rule checking.

11. The method of claim 1, wherein said optical correction program having multiplicate layer handling capability calculates effects of shapes located outside a selected marker layer upon a lithographically simulated printed image of each multiplicate shape within said selected marker layer.

12. The method of claim 1, wherein said steps of marking said regions, adding said multiplicate shapes, performing said lithographic simulations, calculating said lithographic performance metrics, generating said modified chip design layout, and storing said data are performed by at least one computing means configured to perform said steps automatically.

13. The method of claim 1, wherein said data is stored in a form of a netlist or in a data format used for the exchange of layout data of integrated circuits.

14. A system for modifying a chip design layout, said system comprising at least one computing means and a non-transitory machine readable storage medium, wherein said at least one computing means is configured to perform the steps of
marking, in a chip design layout, regions of potential lithographic hot spots associated with an instance of a design shape with marker layers;
adding multiplicate shapes to said instance of said design shape in said marker layers in said chip design layout;
performing lithographic simulations for each marker layer in said chip design layout by running an optical correction program having multiplicate layer handling capability, wherein each of said multiplicate shapes is successively employed to perform lithographic simulations for said instance of said design shape in said marker layers;
calculating a lithographic performance metric for each of said lithographic simulations;
generating a modified chip design layout by selecting, for each marker layer, a multiplicate shape that satisfies at least one predefined selection criterion for said lithographic performance metric; and
storing data representing said modified chip design layout in said non-transitory machine readable storage medium by encoding said data therein.

15. The system of claim 14, wherein said multiplicate shapes differ among one another in at least one attribute selected from a total cross-sectional area, a length-to-width ratio, and corner rounding.

16. The system of claim 14, wherein said at least one computing means is configured to perform further steps of:
determining whether a selected region for lithographic simulation includes any of said marker layers; and
running a normal optical correction program on said selected region if said selected region does not include any of said marker layers.

17. The system of claim 14, wherein said at least one computing means is configured to perform further steps of:
determining whether a selected region for lithographic simulation includes any of said marker layers; and
running said optical correction program having multiplicate layer handling capability on said selected region if said selected region includes any of said marker layers.

18. The system of claim 14, wherein said at least one computing means is configured to perform further steps of:
dividing said chip design layout into a number R of regions, wherein each of said marker layers is included in one of said number R of regions;
successively performing a lithographic simulation on each of said number R of regions, wherein said optical correction program having multiplicate layer handling capability is run only if a selected region includes one or more of said marker layers.

19. The system of claim 14, wherein said lithographic performance metric includes at least one lithographically simulated quantity selected from a width of an exposure dose window, a range of depth of focus, an area of a two dimensional process window for exposure dose and depth of focus, and a mathematically weighted combination thereof.

20. The system of claim 14, wherein said optical correction program having multiplicate layer handling capability calculates effects of shapes located outside a selected marker layer upon a lithographically simulated printed image of each multiplicate shape within said selected marker layer.

* * * * *